United States Patent
Resch et al.

(10) Patent No.: US 10,372,380 B2
(45) Date of Patent: Aug. 6, 2019

(54) ASSERTING INTEGRITY WITH A VERIFIABLE CODEC

(71) Applicant: International Business Machines Corporation, Armonk, NY (US)

(72) Inventors: Jason K. Resch, Chicago, IL (US); Mark D. Seaborn, Algonquin, IL (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/446,866

(22) Filed: Mar. 1, 2017

(65) Prior Publication Data
US 2018/0254784 A1 Sep. 6, 2018

(51) Int. Cl.
| | | |
|---|---|---|
| H03M 13/00 | (2006.01) |
| G06F 3/06 | (2006.01) |
| G06F 11/10 | (2006.01) |
| H03M 13/37 | (2006.01) |
| H03M 13/15 | (2006.01) |

(52) U.S. Cl.
CPC .............. *G06F 3/067* (2013.01); *G06F 3/064* (2013.01); *G06F 3/0619* (2013.01); *G06F 11/1076* (2013.01); *H03M 13/3761* (2013.01); *H03M 13/1515* (2013.01)

(58) Field of Classification Search
None
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Mujtaba M Chaudry
(74) *Attorney, Agent, or Firm* — Garlick & Markison; Timothy W. Markison; Timothy D. Taylor

(57) ABSTRACT

A method includes retrieving a decode threshold number of encoded data slices, wherein codecs process, in an order, a data segment and the processed data segment is encoded into a set of encoded data slices. The method further includes decoding the decode threshold number of encoded data slices to recover the processed data segment. In a reversed order to the order, applying a first codec on the processed data segment to produce a first partially processed recovered data segment. When the first codec is a verifiable codec, the method further includes separating the first partially processed recovered data segment into an initial integrity value and a processed data segment. The method further includes calculating a new integrity value from the processed data segment. When the new integrity value substantially matches the initial integrity value, the method further includes indicating that the set of encoded data slices is authentic.

14 Claims, 6 Drawing Sheets

(56) References Cited

U.S. PATENT DOCUMENTS

| | | | |
|---|---|---|---|
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,070,003 A * | 5/2000 | Gove | G06F 15/17375 |
| | | | 710/317 |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 9,167,277 B2 * | 10/2015 | Cilfone | H04N 21/23116 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Saran et al. | |
| 2007/0283167 A1 | 12/2007 | Venters, III et al. | |
| 2008/0140849 A1 * | 6/2008 | Collazo | H04L 29/06027 |
| | | | 709/229 |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2012/0027134 A1 * | 2/2012 | Gladwin | H04L 1/0045 |
| | | | 375/340 |
| 2013/0304711 A1 * | 11/2013 | Resch | G06F 17/30371 |
| | | | 707/690 |
| 2014/0298061 A1 * | 10/2014 | Volvovski | G06F 3/0625 |
| | | | 713/323 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32

Zeilenga; Lightweight Directory Access Protocol (LDAP): Technical Specification Road Map; IETF Network Working Group; RFC 4510; Jun. 2006; pp. 1-8

Zeilenga; Lightweight Directory Access Protocol (LDAP): String Representation of Distinguished Names; IETF Network Working Group; RFC 4514; Jun. 2006; pp. 1-15

Sermersheim; Lightweight Directory Access Protocol (LDAP): The Protocol; IETF Network Working Group; RFC 4511; Jun. 2006; pp. 1-68

Satran, et al.; Internet Small Computer Systems Interface (iSCSI); IETF Network Working Group; RFC 3720; Apr. 2004; pp. 1-257

Xin, et al.; Evaluation of Distributed Recovery in Large-Scale Storage Systems; 13th IEEE International Symposium on High Performance Distributed Computing; Jun. 2004; pp. 172-181

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner distributed, or dispersed, storage network (DSN) 10

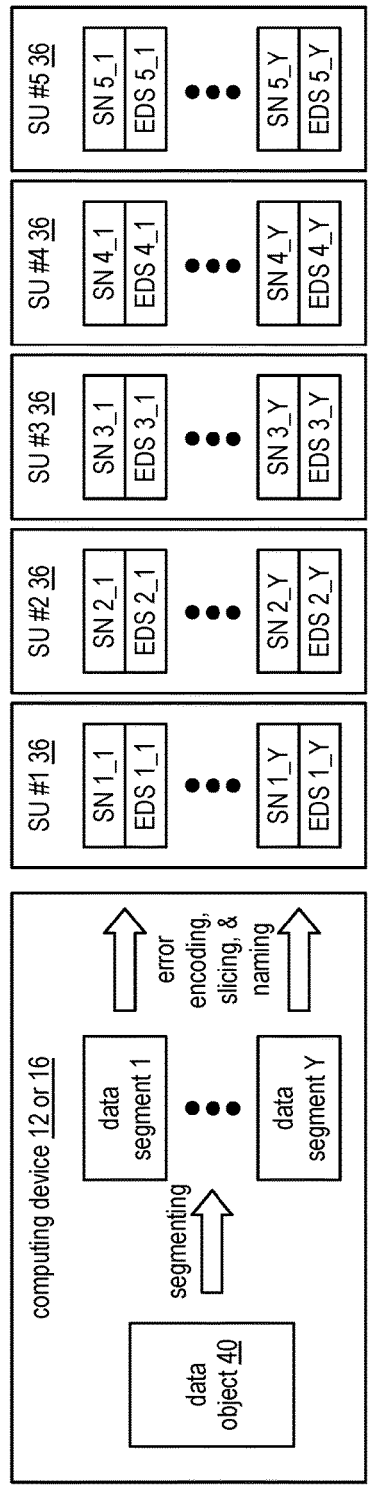
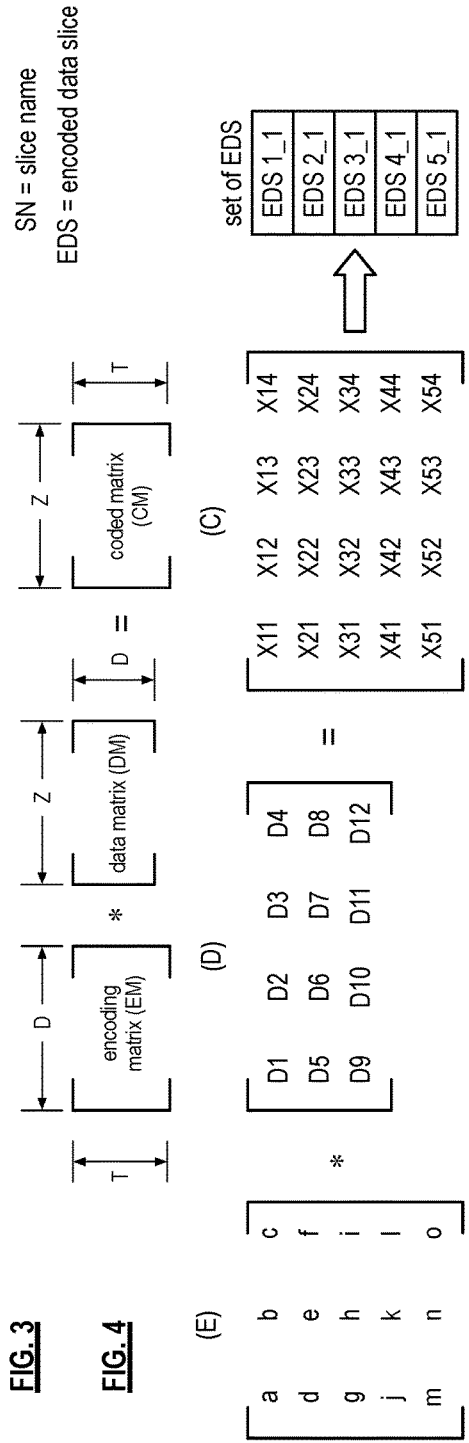
FIG. 3
FIG. 4
FIG. 5
FIG. 6

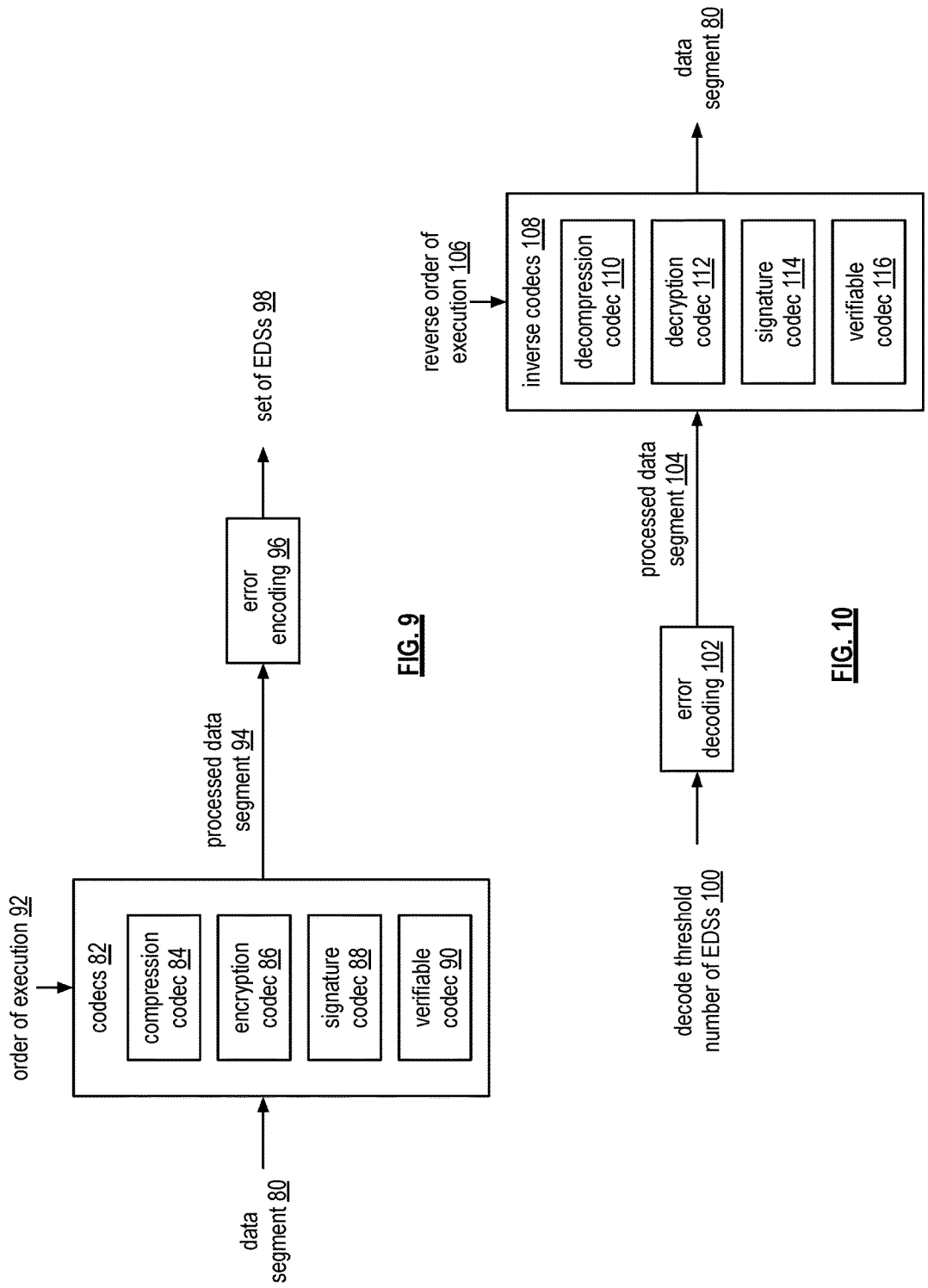

US 10,372,380 B2

ASSERTING INTEGRITY WITH A VERIFIABLE CODEC

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Within a dispersed storage system, integrity of the data is typically done on the raw data prior to data processing (e.g., compression and/or encryption) and encoding. The integrity information is included with the data during the encoding phase such that the integrity value is encoded into the resulting encoded data slices. When the encoded data slices are decoded, the integrity value is recaptured and used to ensure that the encoded data slices have not been altered in an unauthorized manner. When data was compressed and/or encrypted, the reverse functions are performed before the integrity can be check. This consumes processing resources.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 9 is a schematic block diagram of an embodiment of processing and encoding a data segment in accordance with the present invention;

FIG. 10 is a schematic block diagram of an embodiment of decoding and reverse processing a set of encoded data slices in accordance with the present invention.

DETAILED DESCRIPTION OF THE INVENTION

Figure 1:
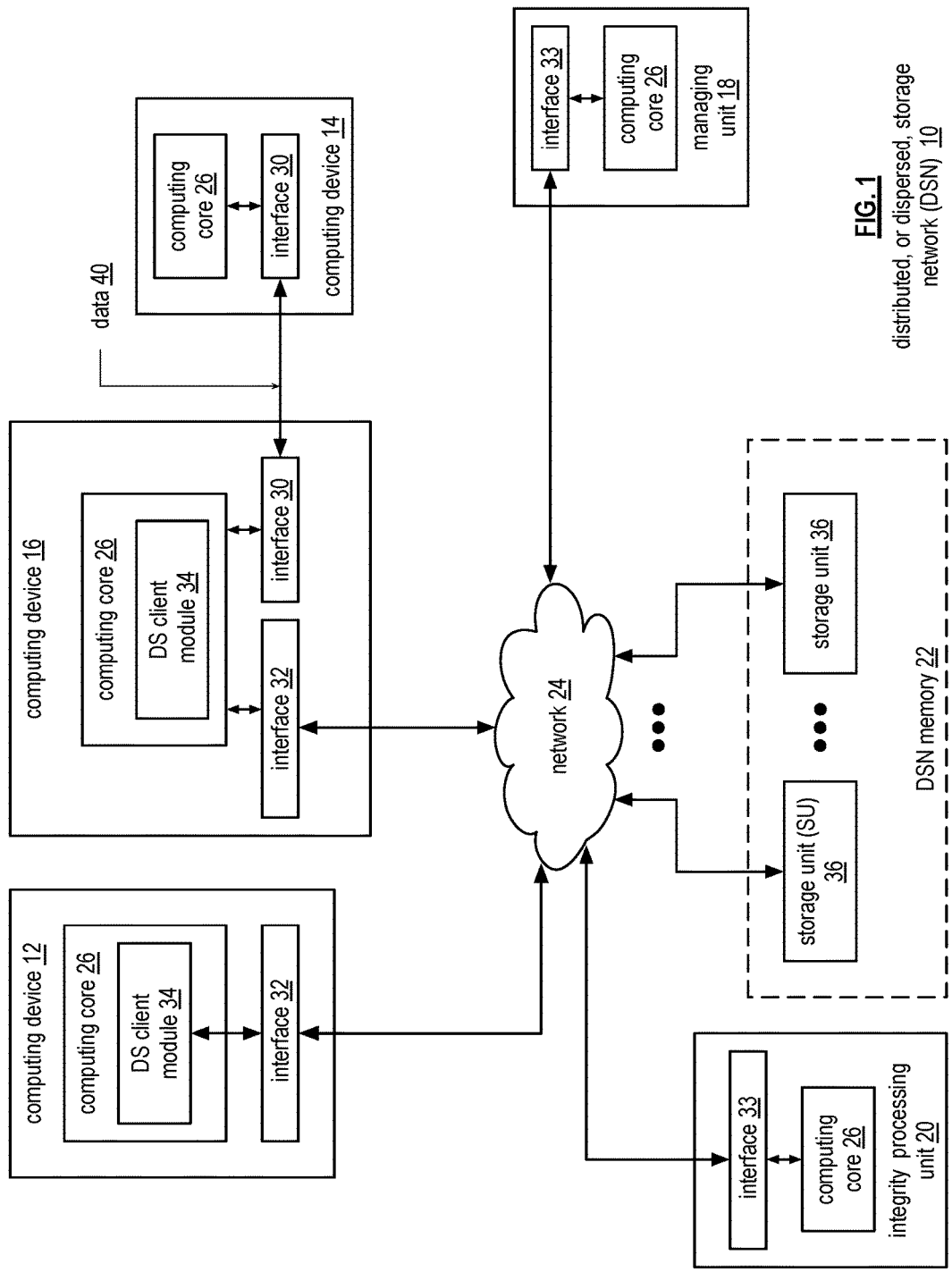
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
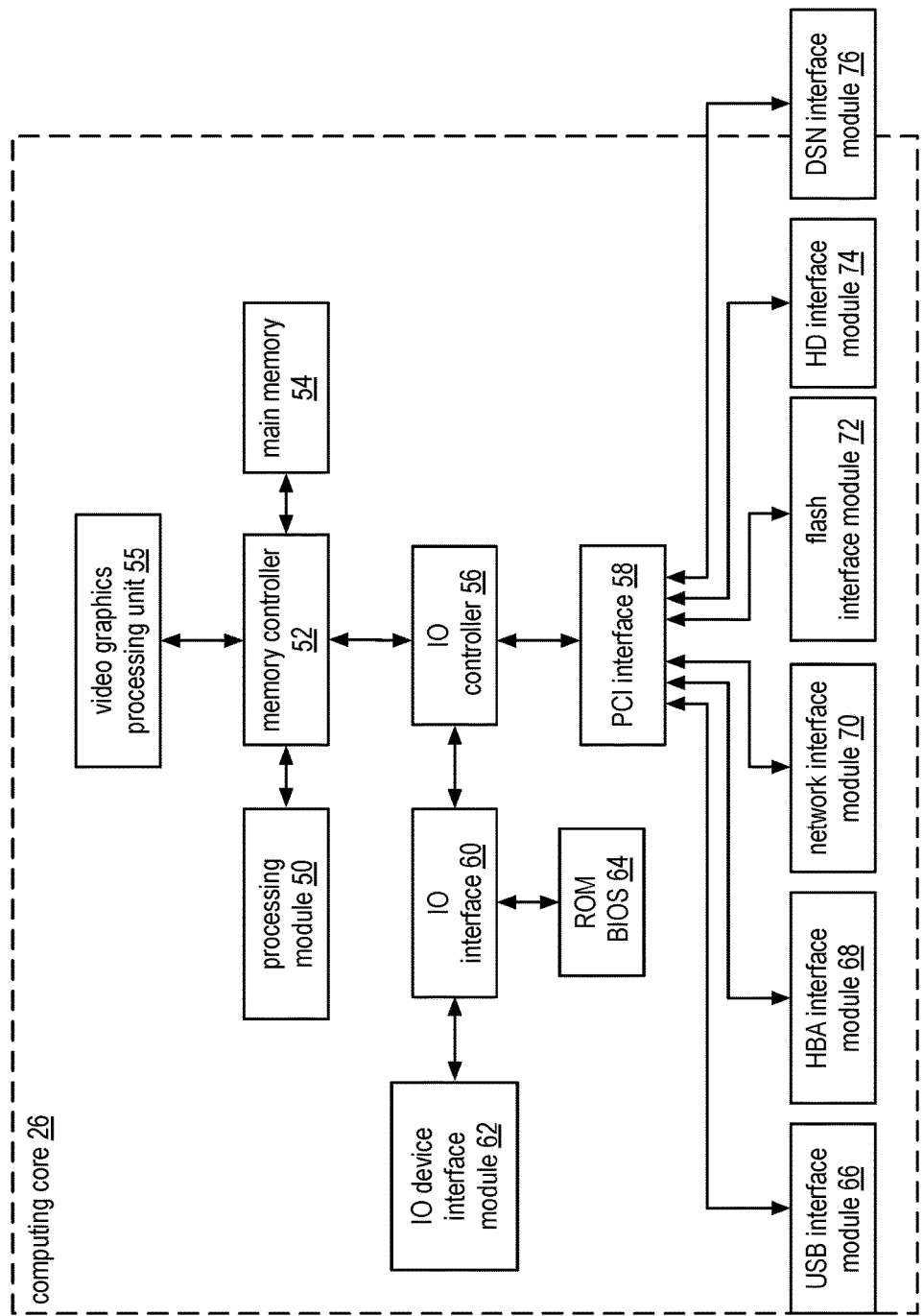
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
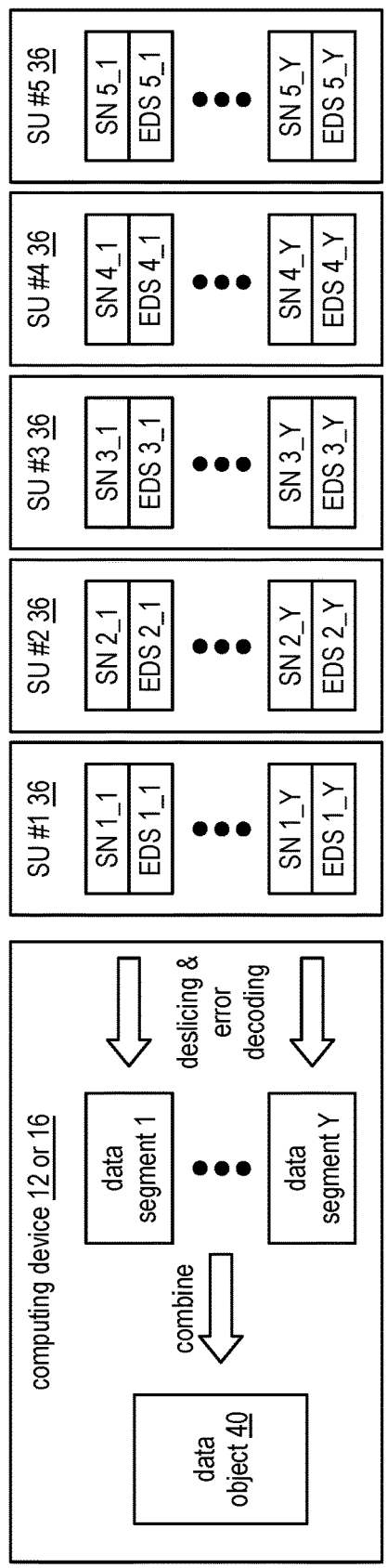
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

FIG. 9 is a schematic block diagram of an embodiment of processing and encoding a data segment within a computing device. In particular, this embodiment expands on the error encoding of FIG. 3 to include a plurality of codecs 82 that process a data segment 80 prior to error encoding 96 via an error encoder or module 96 of the computing device. The encoder 96 performs the functions as described with references to one or more of FIGS. 3-6.

The codecs 82 include two or more of a compression codec 84, an encryption codec 86, a signature codec 88, and a verifiable codec 90. The compression codec 84 and the encryption codec 86 may be of conventional implementations. The signature codec 88 performs a digital signature on the data segment 80 or some other form of certification to authenticate a source of the data segment 80.

The verifiable codec 90 is a function performed by the computing device that inputs data (ID) to yield output data (OD). For example, the verifiable codec takes in an ID, computes an integrity check value (such as a CRC, hash, mask generating function, hmac, etc.), and appends it to the ID to form the OD. The verifiable codec 90 further functions to recover the ID from the OD with a high probability of rejecting invalid ODs when they are corrupt, invalid, or unauthorized.

The computing device performs one or more of the codecs 82 in a particular order of execution 92, which may be determined by the computing device or received as an input from another computing device of the DSN. For example, the order 92 includes performing the compression codec 84, then performing the encryption codec 86, and then performing the verification codec 90. As another example, the order 92 includes performing the signature codec 88, then performing the encryption codec 86, then performing the compression codec 84, and then performing the verification codec 90. As yet a further example, the order 92 includes performing the verification codec 90 first and then one or more of the other codecs 84-88.

FIG. 10 is a schematic block diagram of an embodiment of decoding and reverse processing a set of encoded data slices within a computing device. In particular, this embodiment expands on the error decoding of FIG. 7 to include a plurality of inverse codecs 108 that process a processed data segment 104 after error decoding via an error decoder or module 102 of the computing device. The decoder 102 performs the functions as described with references to one or more of FIGS. 7-8 on a decode threshold number of encoded data slices (EDSs) 100.

The inverse codecs 108 include two or more of a decompression codec 110, a decryption codec 112, a signature codec 114, and a verifiable codec 116. The decompression codec 110 and the decryption codec 112 may be of conventional implementations and perform, respectfully, the inversion of the compression codec 84 and the encryption codec 86. The signature codec 114 performs a digital signature verification of the signature associated with the data segment 80 as created by the signature codec 90.

The verifiable codec 116 performs a complimentary function as the verifiable codec 90. For example, the verifiable codec takes in data (e.g., the processed data segment), separates the data segment from the integrity value appended thereto, and computes an integrity check value (such as a CRC, hash, mask generating function, hmac, etc.) from the separated data segment. With this approach, the verifiable codec 116 has a high probability of rejecting invalid data segments when they are corrupt, invalid, or unauthorized. Note that the computing device performs one or more of the inverse codecs 108 in a reverse order of execution 106 (i.e., the reverse of the order of execution 92 of the codecs 82).

Figure 11:
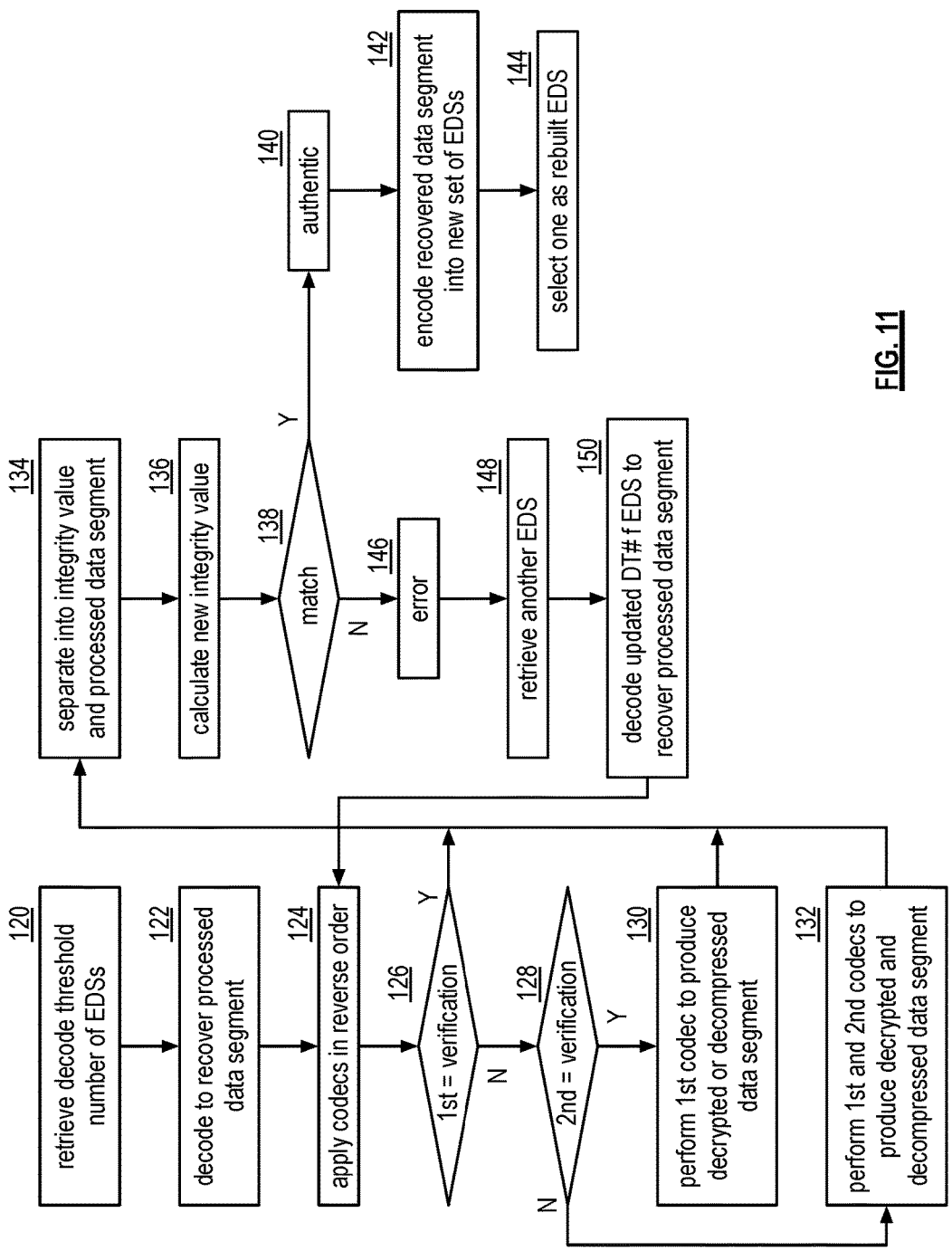
FIG. 11 is a logic diagram of an embodiment of a method for verifying integrity of a stored data segment in accordance with the present invention.

FIG. 11 is a logic diagram of an embodiment of a method for verifying integrity of a stored data segment that begins at step 120 where a computing device retrieves a decode threshold number of encoded data slices of a set of encoded data slices from storage units of a DSN. The set of encoded data slices correspond to a processed data segment being dispersed storage error encoded in accordance with dispersed storage error encoding parameters (e.g., encoding function, pillar width, decode threshold, write threshold, read threshold, etc.). A plurality of codecs 82 (two or more) process, in an order 92, a data segment 80 of a data object to produce the processed data segment.

The method continues at step 122 where the computing device decodes the decode threshold number of encoded data slices to recover the processed data segment. For example, the computing device performs the function described with reference to one or more of FIGS. 7 and 8. The method continues at step 124 where the computing device applies, in a reversed order to the order, a first codec of the plurality of codecs on the processed data segment to produce a first partially processed recovered data segment.

The method continues at step 126 where the computing device determines whether the verifiable codec is the first codec of the reverse order (i.e., was the last codec on the encoding side). If yes, the method continues at step 134 where the computing device separates the first partially processed recovered data segment into an initial integrity value and a processed data segment (e.g., the data segment with one or more codec functions still applied). The method continues at step 136 where the computing device calculates a new integrity value from the processed data segment. For example, the computing device performs the same function (CRC, hash, mask generating function, hmac, etc.) as was used to create the initial integrity value.

The method continues at step 138 where the computing device determines whether the new integrity value substantially matches the initial integrity value. If yes, the method continues at step 140 where the computing device indicates that the set of encoded data slices is authentic.

The method continues at step 142 where the computing device encodes the first partially processed recovered data segment to produce a new set of encoded data slices. The method continues at step 144 where the computing device selects one encoded data slice of the new set of encoded data slices for replacing a missing or corrupt encoded data slice of the set of encoded data slices. In this manner, the computing device is rebuilding the missing or corrupt encoded data slice.

If, at step 138, the computing device determines that the new integrity value does not substantially matches the initial integrity value, the method continues at step 146 where the computing device generates an integrity check error message. The method may further continue at step 148 where the computing device requests and receives another encoded data slice of the set of encoded data slices. Note that the other encoded data slice was not included in the decode threshold number of encoded data slices.

The method continues at step 150 where the computing device replaces one of the encoded data slices of the decode threshold number of encoded data slices with the other encoded data slice. The computing device then decodes the updated decode threshold number of encoded data slices to recover the processed data segment and repeats the verification of the recovered processing data segment. If it passes, then the replaced encoded data slice was corrupt, outdated, or unauthorized and is requiring rebuilding. If it does not pass, then another encoded data slice of the decode threshold number of encoded data slices is replaced and the process is repeated until the encoded data slice in need of rebuilding is identified.

If, at step 126, the computing device determines that the verifiable codec is not the first codec of the reverse order, the method continues at step 128 where the computing device determines whether the verifiable codec is the second codec in the reverse order. If yes, the method continues with the computing device performing the decompression codec or the decryption codec to produce a decompressed recovered data segment or a decrypted recovered data segment. The method continues at step 134 where the computing device executes the verifiable codec to separate out the initial integrity value and the processed data.

If, at step 128, the computing determines that the verifiable codec is not the second codec in the reverse order, the method continues at step 132 where the computing device decompresses the first partially processed recovered data segment to produce a decompressed recovered data segment and decrypts the decompressed recovered data segment to produce a decrypted recovered data segment. The method continues at step 134 where the computing device performs the verifiable codec to separate out the initial integrity value and the processed data segment.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a computing device of a dispersed storage network (DSN), the method comprises:
   retrieving, by the computing device, a decode threshold number of encoded data slices of a set of encoded data slices from DSN memory, wherein a processed data segment was dispersed storage error encoded to produce the set of encoded data slices and stored in the DSN memory, wherein a data segment of a data object is processed in an order by a plurality of codecs to produce the processed data segment, and wherein the decode threshold number is a minimum number of encoded data slices of the set of encoded data slices needed in order to reconstruct the data segment;
   decoding, by the computing device, the decode threshold number of encoded data slices to recover the processed data segment;
   determining, by the computing device, reverse order of the plurality of codecs based on the order;
   when a first codec of the reverse order of the plurality of codecs is a verifiable codec:
      separating, by the computing device, the processed data segment into an integrity value and a partially processed data segment;
      calculating, by the computing device, a new integrity value from the partially processed data segment;
      determining, by the computing device, whether the new integrity value substantially matches the integrity value; and
      when the new integrity value substantially matches the integrity value, performing, by the computing device, another codec of the reverse order of the plurality of codecs on the partially processed data segment to recover the data segment.

2. The method of claim 1 further comprises:
   when the first codec is a decompression codec and a second codec of the plurality of codecs is the verifiable codec:
      decompressing the processed data segment to produce a decompressed processed data segment;
      separating the decompressed processed data segment into the integrity value and a decompressed partially processed data segment;
      calculating the new integrity value from the decompressed partially processed data segment; and
      when the new integrity value substantially matches the integrity value, indicating that the set of encoded data slices is authentic.

3. The method of claim 1 further comprises:
   when the first codec is a decryption codec and a second codec of the plurality of codecs is the verifiable codec:
      decrypting the processed data segment to produce a decrypted processed data segment;
      separating the decrypted processed data segment into the integrity value and a decrypted partially processed data segment;
      calculating the new integrity value from the decrypted partially processed data segment; and
      when the new integrity value substantially matches the integrity value, indicating that the set of encoded data slices is authentic.

4. The method of claim 1 further comprises:
   when the first codec is a decompression codec, a second codec of the plurality of codecs is a decryption codec, and a third codec of the plurality of codecs is the verifiable codec:
      decompressing the processed data segment to produce a decompressed processed data segment;
      decrypting the decompressed processed data segment to produce a decrypted processed data segment;
      separating the decrypted processed data segment into the integrity value and a decrypted partially processed data segment;
      calculating the new integrity value from the decrypted partially processed data segment; and
      when the new integrity value substantially matches the integrity value, indicating that the set of encoded data slices is authentic.

5. The method of claim 1 further comprises:
when the new integrity value does not substantially match the integrity value, generating an integrity check error message.

6. The method of claim 1 further comprises:
when the new integrity value does not substantially match the integrity value, indicating that at least one of the decode threshold number of encoded data slices has an integrity error;
requesting another encoded data slice of the set of encoded data slices, wherein the other encoded data slice was not included in the decode threshold number of encoded data slices;
replacing one of the encoded data slices of the decode threshold number of encoded data slices with the other encoded data slice to produce an updated decode threshold number of encoded data slices; and
decoding the updated decode threshold number of encoded data slices to recover the processed data segment.

7. The method of claim 1 further comprises:
encoding the processed data segment to produce a new set of encoded data slices; and
selecting one encoded data slice of the new set of encoded data slices for replacing a missing or corrupt encoded data slice of the set of encoded data slices.

8. A computing device comprises:
an interface;
memory; and
a processing module operably coupled to the interface and the memory, wherein the processing module is operable to:
receive, via the interface, a decode threshold number of encoded data slices of a set of encoded data slices from DSN memory, wherein a processed data segment was dispersed storage error encoded to produce the set of encoded data slices and stored in the DSN memory, wherein a data segment of a data object is processed in an order by a plurality of codecs to produce the processed data segment, and wherein the decode threshold number is a minimum number of encoded data slices of the set of encoded data slices needed in order to reconstruct the data segment;
decode the decode threshold number of encoded data slices to recover the processed data segment; and
determine reverse order of the plurality of codecs based on the order;
when a first codec of the reverse order of the plurality of codecs is a verifiable codec:
separate the processed data segment into an integrity value and a partially processed data segment;
calculate a new integrity value from the partially processed data segment;
determine whether the new integrity value substantially matches the integrity value; and
when the new integrity value substantially matches the integrity value, perform, another codec of the reverse order of the plurality of codecs on the partially processed data segment to recover the data segment.

9. The computing device of claim 8, wherein the processing module is further operable to:
when the first codec is a decompression codec and a second codec of the plurality of codecs is the verifiable codec:
decompress the processed data segment to produce a decompressed processed data segment;
separate the decompressed processed data segment into the integrity value and a decompressed partially processed data segment;
calculate the new integrity value from the decompressed partially processed data segment; and
when the new integrity value substantially matches the integrity value, indicate that the set of encoded data slices is authentic.

10. The computing device of claim 8, wherein the processing module is further operable to:
when the first codec is a decryption codec and a second codec of the plurality of codecs is the verifiable codec:
decrypt the processed data segment to produce a decrypted processed data segment;
separate the decrypted processed data segment into the integrity value and a decrypted partially processed data segment;
calculate the new integrity value from the decrypted partially processed data segment; and
when the new integrity value substantially matches the integrity value, indicating that the set of encoded data slices is authentic.

11. The computing device of claim 8, wherein the processing module is further operable to:
when the first codec is a decompression codec, a second codec of the plurality of codecs is a decryption codec, and a third codec of the plurality of codecs is the verifiable codec:
decompress the processed data segment to produce a decompressed processed data segment;
decrypt the decompressed processed data segment to produce a decrypted processed data segment;
separate the decrypted processed data segment into the integrity value and a decrypted partially processed data segment;
calculate the new integrity value from the decrypted partially processed data segment; and
when the new integrity value substantially matches the integrity value, indicate that the set of encoded data slices is authentic.

12. The computing device of claim 8, wherein the processing module is further operable to:
when the new integrity value does not substantially match the integrity value, generate an integrity check error message.

13. The computing device of claim 8, wherein the processing module is further operable to:
when the new integrity value does not substantially match the integrity value, indicate that at least one of the decode threshold number of encoded data slices has an integrity error;
receive, via the interface, another encoded data slice of the set of encoded data slices, wherein the other encoded data slice was not included in the decode threshold number of encoded data slices;
replace one of the encoded data slices of the decode threshold number of encoded data slices with the other encoded data slice to produce an updated decode threshold number of encoded data slices; and
decode the updated decode threshold number of encoded data slices to recover the processed data segment.

14. The computing device of claim 8, wherein the processing module is further operable to:
- encode the processed data segment to produce a new set of encoded data slices; and
- select one encoded data slice of the new set of encoded data slices for replacing a missing or corrupt encoded data slice of the set of encoded data slices.

* * * * *